United States Patent
Hakenes

(10) Patent No.: US 10,162,019 B2
(45) Date of Patent: Dec. 25, 2018

(54) METHOD AND APPARATUS FOR DETERMINING A STRAY MAGNETIC FIELD IN THE VICINITY OF A SENSOR

(71) Applicant: Micronas GmbH, Freiburg (DE)

(72) Inventor: Rolf Hakenes, Glottertal (DE)

(73) Assignee: TDK-MICRONAS GMBH, Freiburg (DE)

( * ) Notice: Subject to any disclaimer, the term of this patent is extended or adjusted under 35 U.S.C. 154(b) by 0 days.

(21) Appl. No.: 14/812,517

(22) Filed: Jul. 29, 2015

(65) Prior Publication Data

US 2016/0033586 A1  Feb. 4, 2016

(30) Foreign Application Priority Data

Aug. 1, 2014  (DE) .......... 10 2014 110 974

(51) Int. Cl.
*G01R 33/07* (2006.01)
(52) U.S. Cl.
CPC .................. *G01R 33/07* (2013.01)
(58) Field of Classification Search
CPC ...................................... G01R 33/07
USPC ....................................... 324/251
See application file for complete search history.

(56) References Cited

U.S. PATENT DOCUMENTS

| | | | | |
|---|---|---|---|---|
| 7,495,432 B2* | 2/2009 | Kato | .......... | G01D 5/245 324/174 |
| 8,729,890 B2* | 5/2014 | Donovan | .......... | G01R 33/0029 324/161 |
| 8,754,641 B1* | 6/2014 | McKee | .......... | A01L 11/00 168/45 |
| 2003/0193328 A1* | 10/2003 | Iwashita | .......... | G01D 5/147 324/207.2 |
| 2009/0295375 A1* | 12/2009 | Oohira | .......... | 324/207.21 |
| 2011/0291650 A1* | 12/2011 | Franke | .......... | G01D 5/145 324/251 |
| 2013/0049746 A1* | 2/2013 | Strutz | .......... | H01L 43/04 324/251 |

(Continued)

FOREIGN PATENT DOCUMENTS

| | | |
|---|---|---|
| DE | 10 2011 080 679 A | 4/2012 |
| EP | 0 916 074 B1 | 7/2003 |
| EP | 1 076 924 B1 | 9/2003 |

(Continued)

OTHER PUBLICATIONS

Reymond, S. et al. "True 2-D CMOS Integrated Hall Sensor," IEEE Sensors 2007 Conference, Atlanta, Georgia, USA, Oct. 28-31, 2007, pp. 860-863.

(Continued)

*Primary Examiner* — Jermele M Hollington
*Assistant Examiner* — Christopher P McAndrew
(74) *Attorney, Agent, or Firm* — 24IP Law Group; Timothy Dewitt

(57) ABSTRACT

An apparatus (10) for determining a stray magnetic field in the vicinity of a sensor is described. The apparatus (10) has a multipole permanent magnet (60) with four or more poles and an axis of rotation (70). The multipole permanent magnet (60) produces a magnetic field (65) with magnetic field vectors (67). Two vertical Hall sensors (40*a* and 40) are so arranged in two positions on a circular path (50) about the axis of rotation, such that the sum of the magnet field vectors (67) measured at the two positions is substantially zero.

4 Claims, 5 Drawing Sheets

(56) References Cited

U.S. PATENT DOCUMENTS

2013/0069640 A1* 3/2013 Ausserlechner ..... G01R 33/077
324/251

FOREIGN PATENT DOCUMENTS

| EP | 1 777 501 A1 | 4/2007 |
| EP | 2 174 153 B1 | 12/2010 |
| EP | 2 354 769 A1 | 8/2011 |
| EP | 2 149 797 B1 | 5/2012 |
| GB | 2505226 A * | 2/2014 |
| WO | WO 2014029885 A1 * | 2/2014 |

OTHER PUBLICATIONS

Metz et al. "Contactless Angle Measurement using Four Hall Devices on Single Chip," Solid State Sensors and Actuators, 1997. Transducers '97 Chicago., 1997 International Conference on (vol. 1 ).

* cited by examiner

METHOD AND APPARATUS FOR DETERMINING A STRAY MAGNETIC FIELD IN THE VICINITY OF A SENSOR

CROSS-REFERENCE TO RELATED APPLICATIONS

This application claims priority to and benefit of German Patent Application No. DE 10 2014 110 974.0, filed on 1 Aug. 2014, and entitled "Method for reducing the influence of stray magnetic fields from current carrying conductors on systems for the measurement of angles using X/Y Hall sensors and permanent magnets". The entire contents of the application are incorporated herein by reference.

BACKGROUND OF THE INVENTION

Field of the Invention

The invention relates to an apparatus and a method for determining a stray magnetic field in the vicinity of a sensor.

Description of the Related Art

The contactless measurement of a rotation angle with the aid of the Hall effect is known in the art. For example, an apparatus is known, from the publication by Reymond, S. et al., "True 2-D CMOS Integrated Hall Sensor", IEEE SENSORS 2007 Conference, pages 860-863, for the contactless measurement of a rotation angle, having a semiconductor substrate in which 64 so-called vertical Hall sensors as magnetic field sensors are integrated. The magnetic field sensors of this publication are arranged at equally-spaced intervals along a circular path disposed in the chip plane of the semiconductor substrate. The vertical planes, in which the magnetic field sensors are positioned, are each arranged radially to a notional center axis extending through the center of circle of the circular path and the vertical planes are positioned orthogonally to the chip plane. The magnetic field sensors are connected to a scanning device such that the measurement signals from the individual magnetic field sensors are connected consecutively to a differential output connector to produce a rotation scanning signal. The values from the magnetic field sensors are thus read out in cyclically rotating fashion.

Metz et al. also describe the contactless measurement of a rotation angle in a publication "Contactless Angle Measurement using Four Hall Devices on Single Chip", Transducers, 1997 International Conference on Solid-State Sensors and Actuators, Chicago, 16-19 Jun. 1997. This publication shows four lateral Hall sensors arranged at equally spaced intervals on a circular path disposed in the chip plane of the semiconductor substrate. A permanent magnet having two poles is attached at the end of a rotating axle and generates a magnetic field in the Hall sensors. The same apparatus is described in the European Patent Publication No. EP-B-0 916 074.

The known apparatuses have in common that a permanent magnet is mounted on a rotatable element and generates a magnetic field that is captured by the Hall sensor. One issue in such apparatus is the presence of any stray magnetic fields or interference fields in the surroundings of the Hall sensor. A signal processing processor needs to compensate the measured values received from the Hall sensors in order to compensate for these stray magnetic fields. This compensation is possible in a relatively simple fashion for a substantially homogeneous background field. The compensation for a magnetic field that is generated by current flowing in a nearby conductor is more difficult, since the calculation of the compensation also has to consider the field gradient of the magnetic field generated by the current in the nearby conductor.

Modern cars have numerous ones of such current-carrying conductors causing such stray magnetic fields. A complete shielding of these stray magnetic fields in the vicinity of a rotation-angle measurement device to avoid interference from the stray magnetic fields is impossible.

The effects of the stray magnetic fields can be substantially eliminated by using a difference determination of the measurements of the magnetic field (signal field plus the contribution of the stray magnetic field) from several ones of a plurality of Hall sensors. This determination is also known in the state of the art. One arrangement for this suppression is the use of a diametric magnet having four lateral Hall sensors arranged on a circle. It is possible to compute the X component and the Y component of a magnetic rotation vector of the stray magnetic field from the difference determination of the measurements from two of these Hall sensors.

A further known solution utilizes a four-pole magnet having four vertical Hall sensors which, combined as an X/Y pixel cell, are disposed on a line at an equal distance from each other. The magnetic rotation vector of the stray magnetic field can also be computed using this solution.

In these prior art solutions, the suppression of the stray magnetic field caused by a current-carrying conductor with a current of 400 A at a predetermined distance (e.g. 2.5 cm) is around 51 dB, when the field strength of the permanent magnet is around 30 mT. This interference due to the stray magnetic field would lead however to a maximum angle error of around 0.5° in the measurement of a rotation angle using the four-pole magnet known in the prior art.

A further solution is known from the European Patent Application No EP 1 775 501 A1 which teaches a position sensor for use in an angular sensor for detecting the position of a selection lever in automatic gears. The magnetic field is measured by two sensor elements which enable a correction of any errors due to the presence of stray magnetic fields.

The German Patent Application teaches a magnetic field generating unit which generates a rotating magnetic field with a first partial magnetic field in a first position and a second partial magnetic in a second position. A detection unit can detect a first and second angle at the corresponding first and second positions. Using the values of the first and second angles, an angle value can be calculated which is representative of the direction of the rotating magnetic field.

SUMMARY OF THE INVENTION

There is a requirement to improve the accuracy of an angular measurement of a rotation angle.

This document teaches an apparatus for determining a stray magnetic field in the vicinity of a sensor, which uses a multipole permanent magnet with four or more poles. The multipole permanent magnet, e.g. in the shape of a disk, is rotatably mounted and generates a magnetic field that is symmetrical with respect to the rotation axis disposed in the Z direction. Two pairs of vertical Hall sensors for generating measurement signals corresponding to the X/Y components of the magnetic field are so arranged in two positions in the magnetic field of the multipole permanent magnet at an equal distance to the rotation axis and to the multipole permanent magnet such that the sum of the magnetic field vectors is zero at the corresponding two positions of the vertical Hall sensors. This arrangement results in the sum of the values of the measurement signals of the two vertical Hall sensors together indicating the strength of the stray magnetic field due to an interfering conductor. The computed values of the stray magnetic field can be subtracted from the measured values in order to compute the value of the rotation angle. A more exact calculation of the rotation angle is thereby achieved.

For a better understanding of the invention, a number of exemplary embodiments will be explained by means of the drawings. The invention is not limited to these exemplary embodiments, and aspects of one exemplary embodiment can be combined with other aspects of a further exemplary embodiment.

BRIEF DESCRIPTION OF THE DRAWINGS

For a more complete understanding of the present invention and the advantages thereof, reference is now made to the following description and the accompanying drawings, in which.

DETAILED DESCRIPTION OF THE INVENTION

Figure 1:
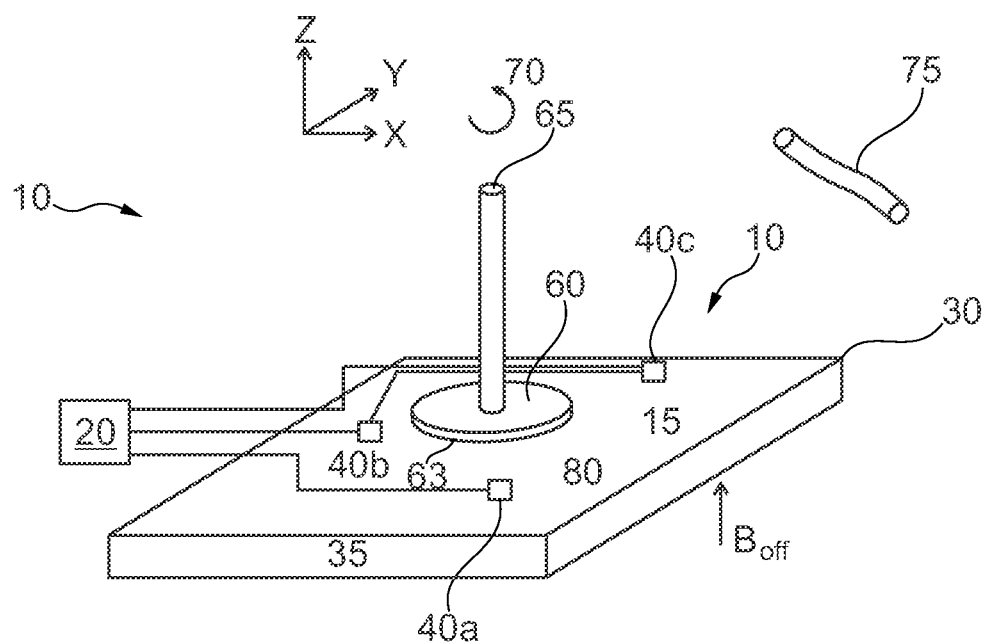
FIG. 1 shows an overview of an apparatus.

FIG. 1 shows an overview of an apparatus 10 for determining a stray magnetic field in the vicinity of a sensor. The apparatus 10 has a disk-shaped permanent magnet 60 attached to a front 63 of an axle. The axle rotates about an axis of rotation 70 and the apparatus 10 can measure the rotation angle 15 of the axle.

On a semiconductor substrate 35, two pairs of vertical Hall sensors 40a and 40b are arranged at equal distance from the rotation axle of the permanent magnet. The Hall sensors 40a, 40b measure the X and/or Y components of the magnetic field and are monolithically integrated in a semiconductor substrate 35. These vertical Hall sensors 40a and 40b are shown in greater detail in FIG. 2 and are later described in more detail with reference to FIG. 2. The circular path 50 is disposed in a chip plane 30 below the permanent magnet 60. The axis of rotation 70 of the axle is parallel to the Z direction, extending through the center of the circle 55 of the circular path 50, and is arranged substantially orthogonally to the chip plane 30 and, as a result, also to the surface of the semiconductor substrate 35. A microprocessor 20 is connected to the Hall sensors 40a and 40b and receives signal values in order to compute the values of the stray magnetic field and the signal field.

FIG. 1 also shows a current-carrying interfering conductor 75 in the vicinity of the apparatus. This interfering conductor 75 causes a stray magnetic field $B_{ST}$ with an X component and a Y component. It will be appreciated that the interfering conductor 75 is merely an example of several possible interfering conductors in the vicinity of the apparatus 10 and the invention is not limited to a single interfering conductor.

Figure 2:
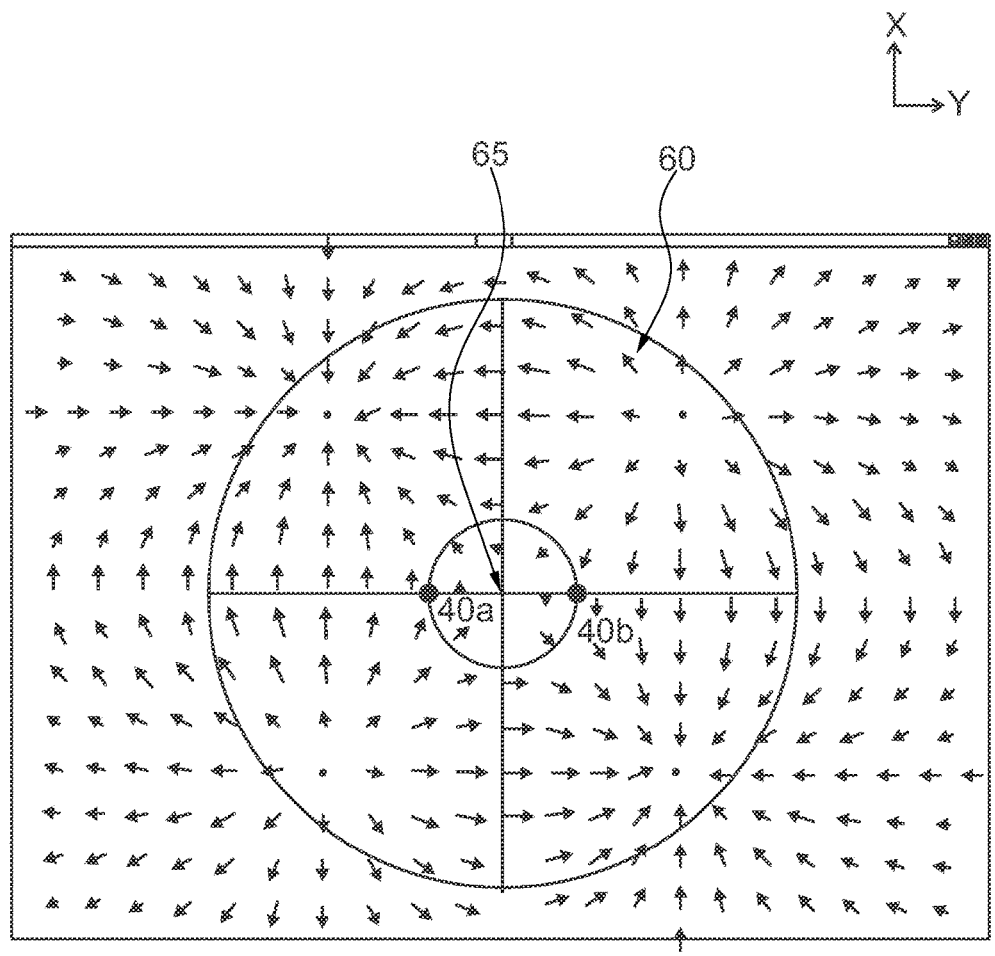
FIG. 2 shows a plan view of the apparatus with the magnetic field lines in a four-pole permanent magnet.

FIG. 2 shows a plan view of the two vertical Hall sensors 40a and 40b disposed on the circular path 50. The permanent magnet 60 is a four-pole magnet and the projection in the X-Y plane of the magnetic field lines 65 is represented by means of arrows in FIG. 2. The two vertical Hall sensors 40a and 40b are disposed on the circular path 50 with reference to the magnetic field, such the sum of the magnetic field vectors in the X-Y plane is always substantially zero, independent of the rotation angle 15 of the permanent magnet 60. The Hall sensors 40a and 40b for measuring the magnetic field vector in the chip plane are known for example from European Patent Application No EP 2 174 153. An alternative 2D magnetic field sensor is known from European Patent Application No. EP 1 076 924. The contents of both of the European Patent Applications are incorporated herein by reference.

Figure 3:
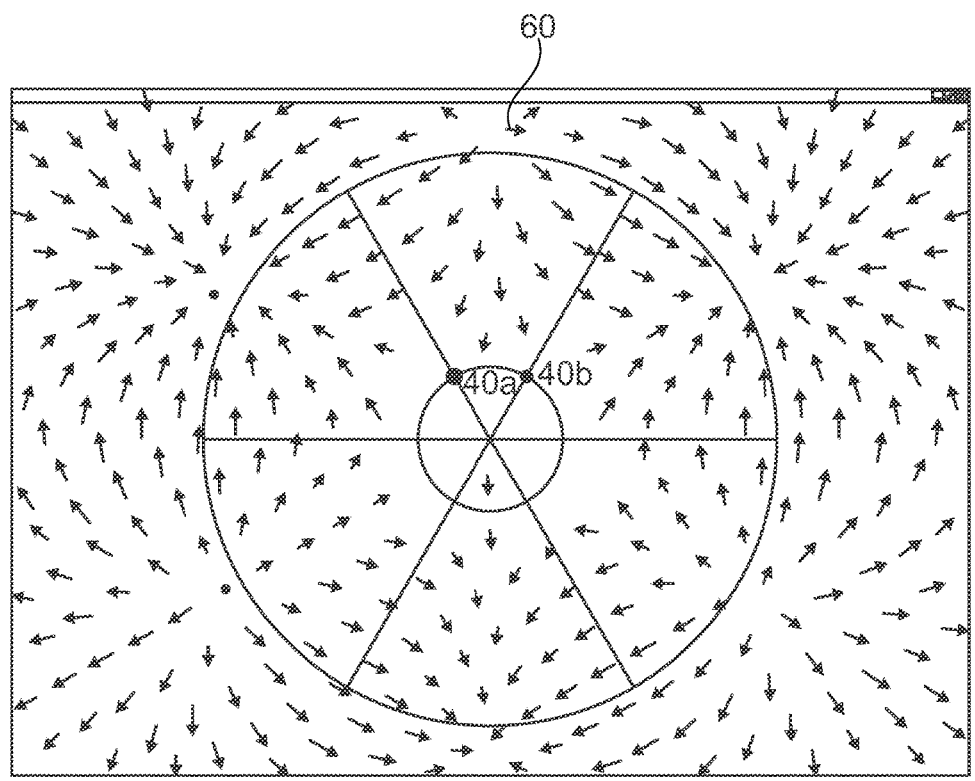
FIG. 3 shows a plan view of the apparatus with a six-pole magnet.

FIG. 3 shows a further aspect of the invention with a six-pole permanent magnet 60 and the corresponding projection of the magnetic field lines 65. It can be seen from FIG. 3 that the two vertical Hall sensors 40a and 40b are not arranged on the circular path 50 opposite each other, but are positioned at an angular distance of around 60°. In this arrangement the vector sum of the magnetic field vectors in the two positions of the two Hall sensors 40a and 40b is zero.

In the exemplary embodiments depicted in FIG. 2 and FIG. 3 therefore the vector sum in the X-Y plane of the magnetic field vectors $B_a$, $B_b$ of the permanent magnet 60 measured by the respective vertical Hall sensors 40a and 40b is substantially zero. This means that the vector sum of the measured values of the magnetic field vectors $B_a$, $B_b$ of the vertical Hall sensors 40a and 40b merely contain the X component and the Y component of the stray magnetic field. Consequently, the sum of the components of the stray magnetic fields can be computed by combining the measurements from the Hall sensors 40a, 40b in the two positions of the Hall sensors 40a, 40b.

Figure 4:
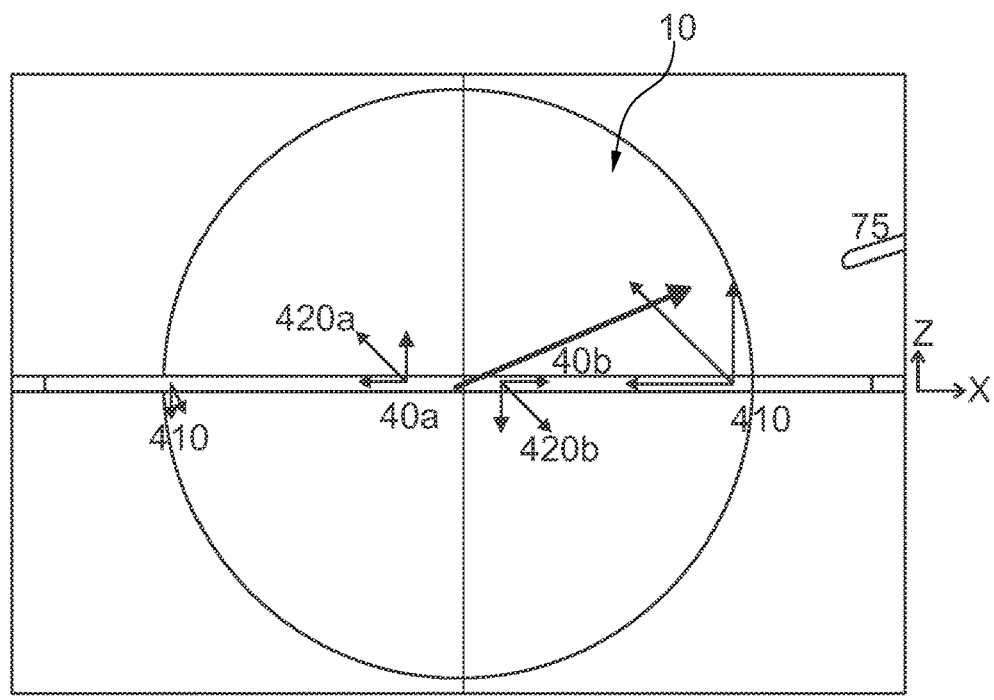
FIG. 4 shows the calculation of the stray magnetic field.

FIG. 4 shows a view of the apparatus 10 with the two vertical Hall sensors 40a and 40b and the magnetic field vectors resulting from the combination of the signal field and the stray magnetic field produced by the conductor 75. The vector sum 410 is the sum of the first magnetic vector 420a of the first Hall sensor 40a and the second magnetic vector 420b of the second Hall sensor 40b. The vector difference 420 is the difference between the first magnetic vector 420a and the second magnetic vector 420b.

It will be appreciated that the vector sum 410 in the X direction is substantially zero. The amplitude of the vector sum 410 gives information about the intensity of the stray magnetic field. The vector difference 420 indicates the direction of the current-carrying conductor 75.

For a complete measurement of the stray magnetic field, the gradient of the stray magnetic field is also required. However, this gradient cannot be measured directly using the described arrangement, but the gradient can be estimated using the following assumptions. It is assumed that the stray magnetic field is produced by the current-carrying conductor 75. The current-carrying conductor 75 has a minimum distance d from the Hall sensors 40a and 40b. In a non-limiting example this minimum distance is 29 mm.

The field gradient of the stray magnetic field is assumed to be linear. In different words, the distance d between the current-carrying conductor 75 and the Hall sensors 40a and/or 40b is substantially greater than the distance 2x (x is the distance between the center of the circle 55 and either of the Hall sensors 40a and 40b) between the respective Hall sensors 40a and 40b.

Figure 5:
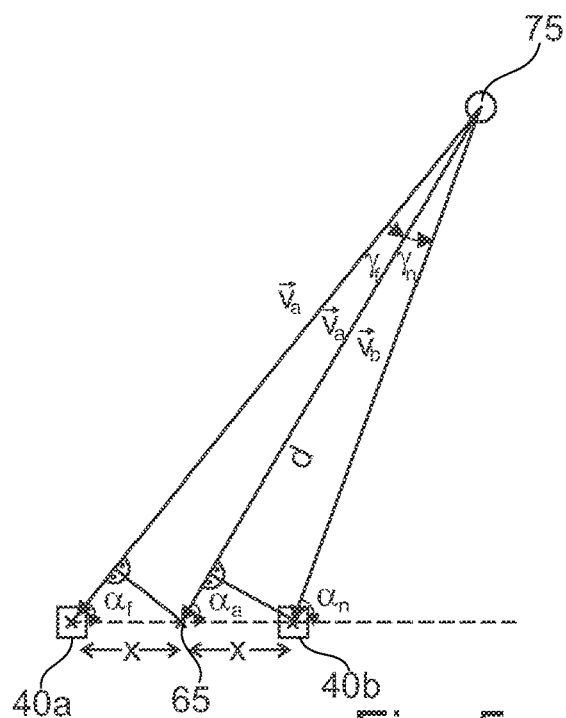
FIG. 5 shows the steps of the method.

The influence of the stray magnetic field becomes continuously smaller the larger the distance of the current-carrying conductor 75 becomes from the Hall sensors 40a and 40b. Consequently, for estimating the distance of the current-carrying conductor 75 from the Hall sensors 40a and 40b, a value can be found which causes a minimal error, even if the current-carrying conductor 75 is assumed to be movable/variable between the minimum distance and an infinite distance. An optimal distance d of 29 mm can be chosen if the minimum distance 25 mm. As a result, a calculation can be deduced from FIG. 5, according to which the field strength can be computed as follows:

$$\gamma_n = \arctan\left(\frac{x \cdot \sin\alpha_\alpha}{d - x \cdot \cos\alpha_\alpha}\right)$$

$$\alpha_n = \alpha_\alpha + \gamma_n$$

$$|\vec{V}_a| = \frac{x \cdot \sin\alpha_\alpha}{\sin\gamma_n}$$

$$\gamma_f = \gamma_n$$

$$\alpha_f = \alpha_\alpha - \gamma_f$$

$$|\vec{V}_b| = x \cdot \cos\alpha_f + d \cdot \cos\gamma_f$$

The computed values $|V_a|$ and $|V_b|$ of the stray magnetic field are subtracted from the measured values of the magnetic field at the vertical Hall sensors 40a and 40b in order to compute the value of the signal field. The rotation angle 15 can be determined with improved accuracy on the basis of this calculation. With the method described here, a suppression of the stray magnetic field of ≥65 dB can be achieved.

Figure 6:
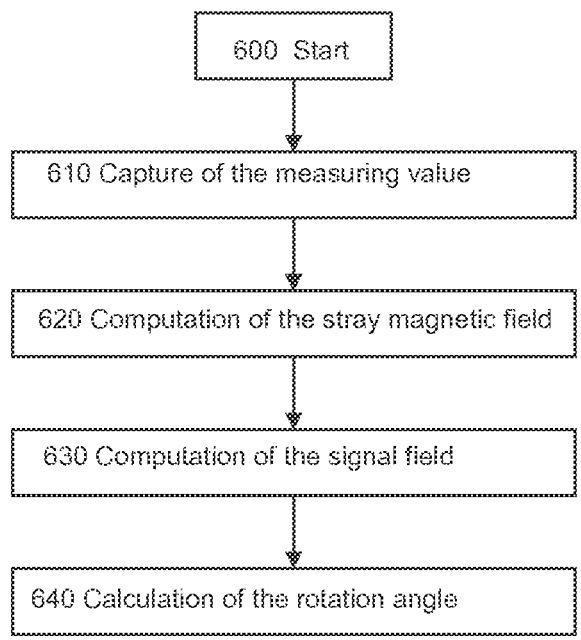
FIG. 6 shows the steps of a method for determining a stray magnetic field in the vicinity of an apparatus in accordance with an embodiment of the invention.

FIG. 6 shows the steps of a method for determining a stray magnetic field in the vicinity of an apparatus as described above, in order to be able to determine, for example, the signal field from the measured values. The method starts at step 600. In a first step 610 the measured values of the Hall sensors 40a and 40b are captured and in step 620 the influence of the stray magnetic field is computed. In an optional additional step 630 subsequently the signal field is computed and afterwards, in a further optional step 640, the rotation angle 15 can be determined.

The apparatus 10 and the method are applied for example in an angle sensor for e.g. accelerator pedals, brakes, throttle valve, etc.

The foregoing description of the preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments as are suited to the particular use contemplated. It is intended that the scope of the invention be defined by the claims appended hereto, and their equivalents. The entirety of each of the aforementioned documents is incorporated by reference herein.

What is claimed is:

1. A method for computing a stray magnetic field in the vicinity of an apparatus, the stray magnetic field being due to a current-carrying interfering conductor, the apparatus comprising a multipole permanent magnet with four or more poles and an axis of rotation, wherein the multipole permanent magnet produces a magnetic field with magnetic field vectors; and two pairs of vertical Hall sensors for producing measurement signals, wherein the current-carrying interfering conductor is located at a first distance (d) from the two pairs of vertical Hall sensors, wherein the first distance is at least twice as great than a second distance (x) between the axis of rotation and either one of the two pairs of vertical Hall sensors, and wherein the two pairs of vertical Hall sensors are arranged in two positions on a circular path about the axis of rotation in the magnetic field of the multipole permanent magnet, such that the sum of the magnetic field vectors measured at the two positions is substantially zero, the method comprising:

measuring the values of the magnetic field at the vertical Hall sensors; computing the values of $|V_a|$ and $|V_b|$ of the stray magnetic field according to the formula:

$$\gamma_n = \arctan\left(\frac{x \cdot \sin\alpha_\alpha}{d - x \cdot \cos\alpha_\alpha}\right)$$

$$\alpha_n = \alpha_\alpha + \gamma_n$$

$$|\vec{V}_a| = \frac{x \cdot \sin\alpha_\alpha}{\sin\gamma_n}$$

$$\gamma_f = \gamma_n$$

$$\alpha_f = \alpha_\alpha - \gamma_f$$

$$|\vec{V}_b| = x \cdot \cos\alpha_f + d \cdot \cos\gamma_f$$

subtracting the computed values $|V_a|$ and $|V_b|$ of the stray magnetic field from the measured values of the magnetic field at the vertical Hall sensors; and determining the rotation angle.

2. The method of claim 1, further comprising calculating a rotation angle from the measurement signals and the computed stray magnetic field.

3. The method of claim 1, further comprising processing the measurement signals of the Hall sensors by a microprocessor in order to determine a strength of the stray magnetic field.

4. The method of claim 1, further comprising determining an angle value.

* * * * *